(12) United States Patent
Yeh et al.

(10) Patent No.: US 7,916,052 B2
(45) Date of Patent: Mar. 29, 2011

(54) COMPRESSED SENSING CHARACTERIZATION SYSTEM AND METHOD

(75) Inventors: Alex Chen-Chu Yeh, Rockwall, TX (US); Gerald Lothair Fudge, Rockwall, TX (US)

(73) Assignee: L3 Communications Integrated Systems, L.P., Greenville, TX (US)

(*) Notice: Subject to any disclaimer, the term of this patent is extended or adjusted under 35 U.S.C. 154(b) by 88 days.

(21) Appl. No.: 12/501,866

(22) Filed: Jul. 13, 2009

(65) Prior Publication Data

US 2011/0007795 A1  Jan. 13, 2011

(51) Int. Cl.
*H03M 1/00* (2006.01)
(52) U.S. Cl. ........................ 341/122; 341/155
(58) Field of Classification Search .............. 341/122, 341/155, 144, 100, 101
See application file for complete search history.

(56) References Cited

U.S. PATENT DOCUMENTS

| | | | |
|---|---|---|---|
| 6,729,546 B2 * | 5/2004 | Roustaei .................. | 235/462.45 |
| 7,271,747 B2 | 9/2007 | Baraniuk et al. | |
| 7,289,049 B1 | 10/2007 | Fudge et al. | |
| 2002/0130799 A1 * | 9/2002 | Yang et al. ................. | 341/138 |
| 2006/0029279 A1 | 2/2006 | Donoho | |
| 2006/0239336 A1 | 10/2006 | Baraniuk et al. | |
| 2007/0296965 A1 | 12/2007 | Brady et al. | |
| 2008/0062028 A1 * | 3/2008 | Chang ........................ | 341/155 |
| 2008/0129560 A1 | 6/2008 | Baraniuk et al. | |
| 2010/0082302 A1 * | 4/2010 | Garudadri et al. ........... | 702/189 |
| 2010/0246651 A1 * | 9/2010 | Baheti et al. ............... | 375/224 |

OTHER PUBLICATIONS

Behtash Babadi et al., *SPARLS: A Low Complexity Recursive $L_1$-Regularized Least Squares Algorithmm* (Jan. 6, 2009), http://arxiv.org/abs/0901.0734.
Emmanuel Candès et al., *Enhancing Sparcity by Reweighted $\ell_1$ Minimization*, Journal of Fourier Analysis and Applications, (2004).
Rachel Ward, *Compressed Sensing with Cross Validation* (Dec. 7, 2008), http://arxiv.org/abs/0803.1845.
Namrata Vaswani, *Analyzing Least Squares and Kalman Filtered Compressed Sensing*, Proc. IEEE Int'l. Conference on Acous. Speech Sig. Proc. (ICASSP) (2009), http://arxiv.org/abs/0903.5074.
Ingrid Daubechies et al., *Iteratively Re-weighted Least Squares Minimization for Sparse Recovery* (Jun. 14, 2008), http://arxiv.org/abs/0807.0575.
Seung-Jean Kim et al., *An Inerior-Point Method for Large-Scale $\ell_1$-Regularized Least Squares*, IEEE Journal of Selected Topics In Signal Processing vol. 1 No. 4, (Dec. 2007).
Seung-Jean Kim et al., *An Efficient Method for Compressed Sensing*, IEEE Int'l Conference on Image Processing vol. 3, Sep. 16, 2007-Oct. 19, 2007 at 117.

\* cited by examiner

*Primary Examiner* — Peguy JeanPierre
(74) *Attorney, Agent, or Firm* — Hovey Williams LLC

(57) ABSTRACT

A system for characterizing a compressed sensing apparatus is described which broadly includes a random vector generator for generating an input vector, a waveform generator in communication with the random vector generator for converting the input vector into an analog signal, a compressed sensing apparatus in communication with the digital-to-analog converter for determining a digital bit stream from the analog signal, a serial-to-parallel converter for converting the digital bit stream into an input vector; and an electronic processor in communication with the random number generator and the serial-to-parallel converter configured for determining a compressed sensing matrix.

15 Claims, 2 Drawing Sheets

COMPRESSED SENSING CHARACTERIZATION SYSTEM AND METHOD

BACKGROUND

1. Field of the Invention

The present invention relates to reconstruction of sampled signals. More particularly, the invention relates to a system and method for characterizing a compressed sensing system so that the compressed sensing system may more accurately reconstruct a sampled signal.

2. Description of the Related Art

Sampling is a method of converting an analog signal into a numeric sequence. Analog signals are often sampled at spaced time intervals to form digital representations for storage, analysis, processing, or other uses. Typically an analog signal must be sampled at or above its Nyquist rate, which may be defined as twice the bandwidth of the analog signal or twice the highest frequency component of the analog signal in the case of baseband sampling. For wide bandwidth signals, sampling at the Nyquist rate requires a great amount of computing resources, processing power, and data storage. Furthermore, if the sampled data is to be transmitted to a secondary location, a large amount of bandwidth is required as well.

Compressed sensing is one technique developed to address high sampling rates, computing resources, processing power and data storage problems of traditional signal processing techniques. Unfortunately, compressed sensing techniques are highly dependent on the compressed sensing matrix utilized by the compressed sensing apparatus. Utilizing a random compressed sensing matrix which possess certain required properties have been shown to be able to reproduce a signal when used with a compressed sensing apparatus. Unfortunately, while utilizing a random matrix may be effective it should be possible to better reconstruct signals. The first step in doing so, is to understanding the input/output relationship of compressed sensing apparatus so that it can be optimized. No method for doing so has been developed.

Accordingly, there is a need for a system and method for accurately characterizing a compressed sensing apparatus.

SUMMARY

The present invention solves the above-described problems and provides a distinct advance in the art of compressed sensing. More particularly, the present invention provides a system and method that characterizes compressed sensing hardware so that it may more accurately reconstruct an input signal.

In one embodiment, the present invention provides a system for characterizing a compressed sensing apparatus that broadly includes a random vector generator for generating a random input vector of a predetermined length; a waveform generator for converting the random vector into an analog waveform; a compressed sensing apparatus to be characterized and operable to output a stream of digital numbers; a serial-to-parallel converter for converting the stream of digital numbers into an output vector; and an electronic processor for computing a compressed sensing matrix that accurately characterizes the compressed sensing apparatus based on the input vector and output vector.

In another embodiment, the present invention provides a system for characterizing a compressed sensing apparatus that broadly includes a random vector generator for generating a random input vector of a predetermined length; a parallel-to-serial converter for converting the random vector into a digital stream of numbers; a digital-to-analog converter for converting digital stream of numbers into an analog waveform; a compressed sensing apparatus to be characterized and operable to output a stream of digital numbers; a serial-to-parallel converter for converting the stream of digital numbers into an output vector; an electronic memory for storing input vectors and output vectors; and an electronic processor for computing a compressed sensing matrix that accurately characterizes the compressed sensing apparatus based on the input vectors and output vectors.

In another embodiment, the present invention provides a method for characterizing a compressed sensing apparatus comprising generating a random input vector, capturing the input vector, converting the input vector into an analog waveform, utilizing a compressed sensing apparatus on the analog waveform, parallelizing the output from the compressed sensing apparatus into an output vector, and capturing the output vector. The previous steps may be repeated numerous times, and then a compressed sensing matrix is computed which characterizes the compressed sensing apparatus.

In another embodiment, the present invention provides a method for characterizing a compressed sensing apparatus comprising generating a random input vector, capturing the input vector, serializing the vector into a stream of digital numbers, converting the stream of digital numbers into an analog waveform, utilizing a compressed sensing apparatus on the analog waveform, parallelizing the output from the compressed sensing apparatus into an output vector, and capturing the output vector. The previous steps may be repeated numerous times, and then a compressed sensing matrix is computed which characterizes the compressed sensing apparatus.

This summary is provided to introduce a selection of concepts in a simplified form that are further described below in the detailed description below. This summary is not intended to identify key features or essential features of the claimed subject matter, nor is it intended to be used to limit the scope of the claimed subject matter. Other aspects and advantages of the present invention will be apparent from the following detailed description of the embodiments and the accompanying drawing figures.

BRIEF DESCRIPTION OF THE DRAWING FIGURES

Embodiments of the present invention are described in detail below with reference to the attached drawing figures, wherein.

Figure 1:
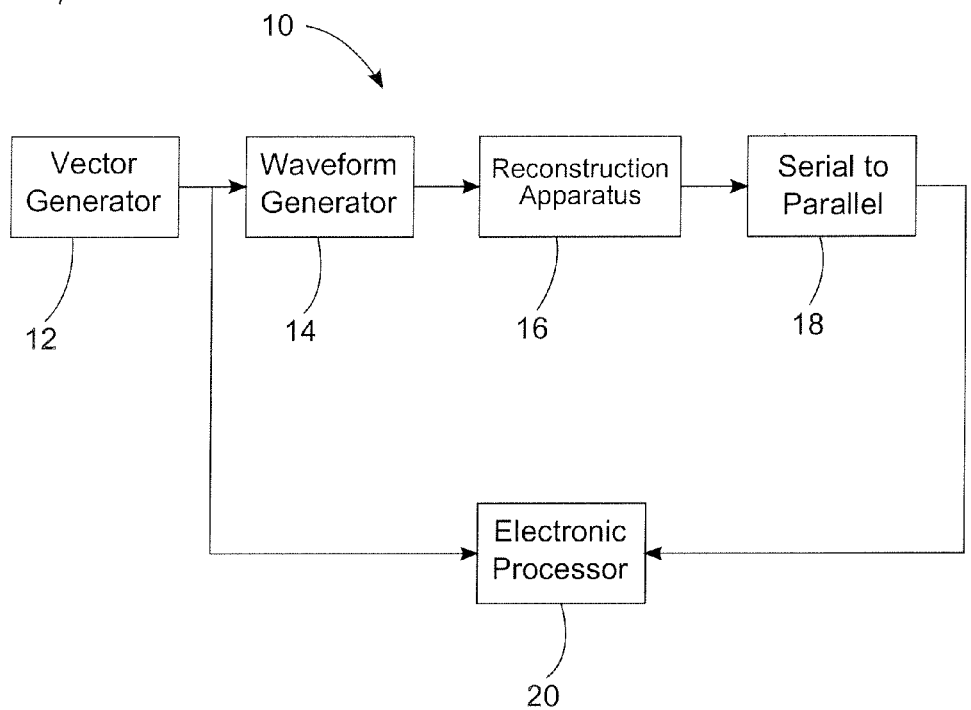
FIG. 1 is a block diagram illustrating components of a system for characterizing a compressed sensing apparatus constructed in accordance with an embodiment of the present invention.

The drawing figures do not limit the present invention to the specific embodiments disclosed and described herein. The drawings are not necessarily to scale, emphasis instead being placed upon clearly illustrating the principles of the invention.

DETAILED DESCRIPTION

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

Turning now to the drawing figures, and particularly FIG. 1, a system 10 constructed in accordance with an embodiment of the invention is illustrated. The system 10 is operable for characterizing a compressed sensing device, as described below, and broadly includes a random vector generator 12, a waveform generator 14, a compressed sensing apparatus 16, a serial-to-parallel converter 18, and an electronic processor 20.

The random vector generator 12 is an electronic device operable to generate a vector of random numbers. The random vector generator 12 may use any algorithm to generate the random vector. The vector generator 12 may be a single electronic component or it may be a combination of components which provide the requisite functionality. In a preferred embodiment, the vector generator 12 generates a zero average Gaussian random vector. The vector may be any length, including just one element, as necessary depending on the circumstances and the apparatus to be characterized.

The waveform generator 14 is an electronic device operable to generate an electronic waveform from a vector. The waveform generator 14 may be a single electronic component or it may be a combination of components which provide the requisite functionality. Preferably, the waveform generator 14 should be operable to generate a waveform having a frequency of at least the maximum frequency of the signal to be reconstructed or the maximum frequency of the noise expected.

The compressed sensing apparatus 16 is an electronic device operable to reconstruct a signal utilizing compressed sensing. The compressed sensing apparatus 16 may be a single electronic component or it may be a combination of components which provide the requisite functionality. Preferably, the compressed sensing apparatus 16 is operable to receive an analog waveform and output a reconstructed digital signal based on the input waveform and the signal reconstruction matrix. One example of a preferred compressed sensing apparatus 16 is described in U.S. Pat. No. 7,289,049 to Fudge et al. which is incorporated herein in its entirety by reference. The details of the compressed sensing apparatus do not need to be known to be appropriately characterized by an embodiment of the current invention. The compressed sensing apparatus may be viewed as a "black box" which will be characterized.

The serial-to-parallel converter 18 is an electronic device operable to convert a stream of numbers into a vector. The serial-to-parallel converter 18 may be a single electronic component or it may be a combination of components which provide the requisite functionality.

The electronic processor 20 is an electronic device operable to perform logical and mathematical operations on data. The electronic processor 20 may be a single electronic component or it may be a combination of components which provide the requisite functionality. The electronic processor 20 may include a central processing unit (CPU), a field-programmable gate array (FPGA), an Application Specific Integrated Circuit (ASIC) or any other electronic component or components which would be operable to perform, or assist in the performance of, the required computation.

The vector generator 12 is used to generate an input vector X containing N random elements. The vector is converted into an analog waveform by the waveform generator 14. The analog waveform is used to excite the compressed sensing apparatus 16 to generate a stream of digital numbers. The serial-to-parallel converter 18 then changes the stream of digital numbers from the compressed sensing apparatus 16 into an output vector Y.

The electronic processor 20 then characterizes the input-output relationship. The relationship between X and Y and the compressed sensing matrix CS can be described by the equation:

$$CS*X=Y$$

Written in an expanded form:

$$CS * \begin{bmatrix} x_1 \\ x_2 \\ \vdots \\ x_n \end{bmatrix} = \begin{bmatrix} y_1 \\ y_2 \\ \vdots \\ y_m \end{bmatrix}$$

The processor 20 can compute a least-square estimate of the CS matrix is obtained by multiplying Y by the pseudo-inverse of X. Thus:

$$CS = \begin{bmatrix} y_1 \\ y_2 \\ \vdots \\ y_m \end{bmatrix} * \begin{bmatrix} x_1 \\ x_2 \\ \vdots \\ x_n \end{bmatrix}^+$$

Additionally, the process of generating an input vector X and capturing the output vector Y may repeated multiple times. For example, K pairs of input and output vector pairs may be combined into a matrix X of inputs and a matrix Y of outputs. Thus, a particular column of the input matrix X indicates a generated random vector from the random vector generator 12 and the matching column of the output matrix Y is the corresponding output from the serial-to-parallel converter 18. This method can be used to better characterize the relationship between X and Y. After the data is collected and formed into the input matrix X and output matrix Y, the processor 20 can compute a least-square estimate of the CS matrix by multiplying the matrix Y by the pseudo-inverse of matrix X. Thus the computation of the CS matrix requires evaluation of the following by the electronic processor:

$$CS = \begin{bmatrix} y_{1,1} & y_{1,2} & \cdots & y_{1,k} \\ y_{2,1} & y_{2,2} & \cdots & y_{2,k} \\ \vdots & \vdots & \ddots & \vdots \\ y_{m,1} & y_{m,2} & \cdots & y_{m,k} \end{bmatrix} * \begin{bmatrix} x_{1,1} & x_{1,2} & \cdots & x_{1,k} \\ x_{2,1} & x_{2,2} & \cdots & x_{2,k} \\ \vdots & \vdots & \ddots & \vdots \\ x_{n,1} & x_{n,2} & \cdots & x_{n,k} \end{bmatrix}^+$$

This may also be simply written:

$$CS=Y*X^+$$

In general, the number of rows n of the input matrix X will be much greater than the number of rows m of the output matrix Y. Thus, the calculated compressed sensing matrix CS will generally have more columns than rows. This is not required, however.

Figure 2:
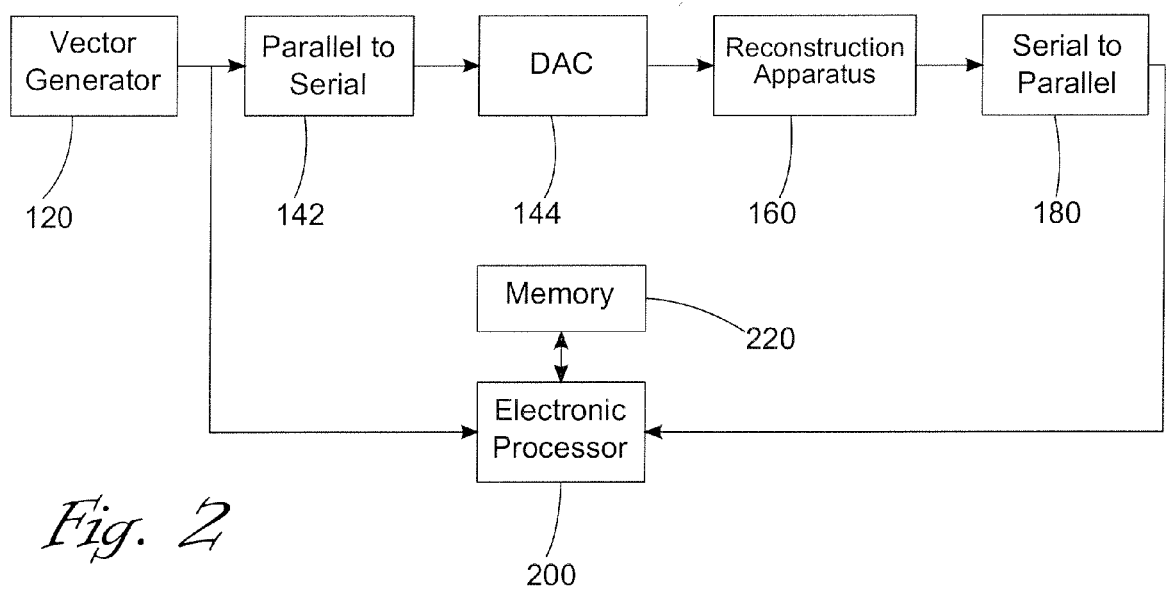
FIG. 2 is a another block diagram illustrating components of a system for characterizing a compressed sensing apparatus constructed in accordance with another embodiment of the present invention.

FIG. 2 shows a system 100 constructed in accordance with another embodiment of the current invention. Many elements of the system 100 of FIG. 2 are generally equivalent to those of the system 10 of FIG. 1. Specifically, elements 120, 160, 180 and 200 of FIG. 2 correspond to 12, 16, 18 and 20 of FIG. 1. In the system 100, the waveform generator 14 is accomplished through a parallel-to-serial converter 142 and a digital-to-analog converter (DAC) 144, as explained below.

The parallel-to-serial converter 142 is an electronic component or components operable to covert the vector produced by the vector generator 120 into a serial stream of numbers. The parallel-to-serial converter 142 may be a single electronic component or it may be a combination of components which provide the requisite functionality.

The digital-to-analog converter 144 is an electronic component or components operable to convert a serial stream of numbers into an analog waveform. The digital-to-analog converter 144 may be a single electronic component or it may be a combination of components which provide the requisite functionality.

The system 100 may also include electronic memory 220 coupled with the electronic processor to store information prior to, during and after computation of the compressed sensing matrix. The electronic memory 220 may be a single electronic component or it may be a combination of components which provide the requisite functionality. The electronic memory 220 may include, SRAM, DRAM, or Flash, among others.

Figure 3:
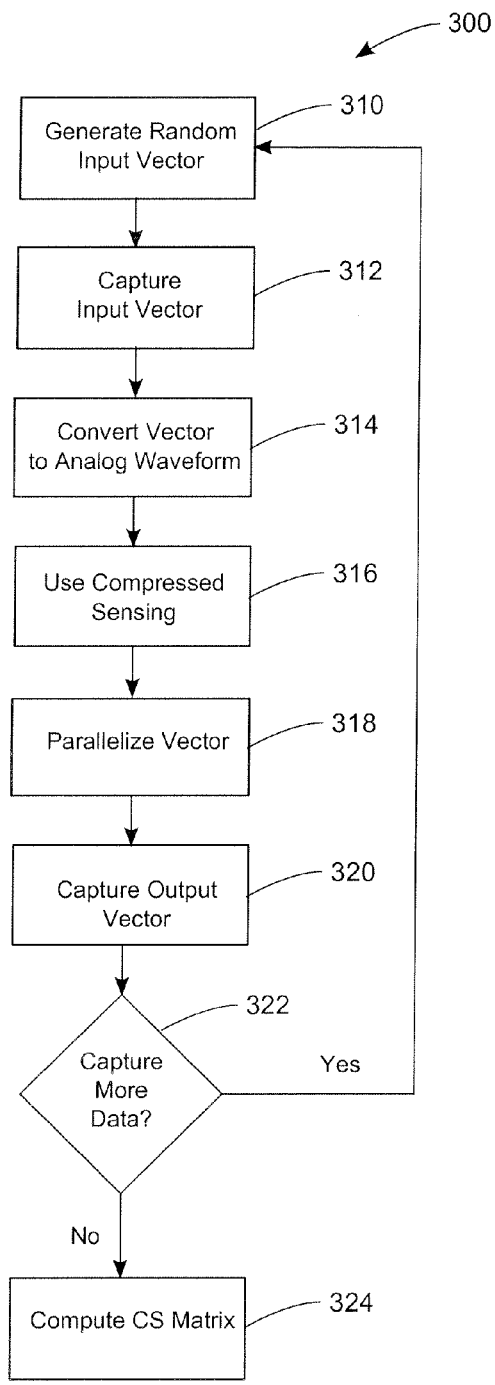
FIG. 3 is a flowchart illustrating a method of an embodiment of the present invention.
Figure 4:
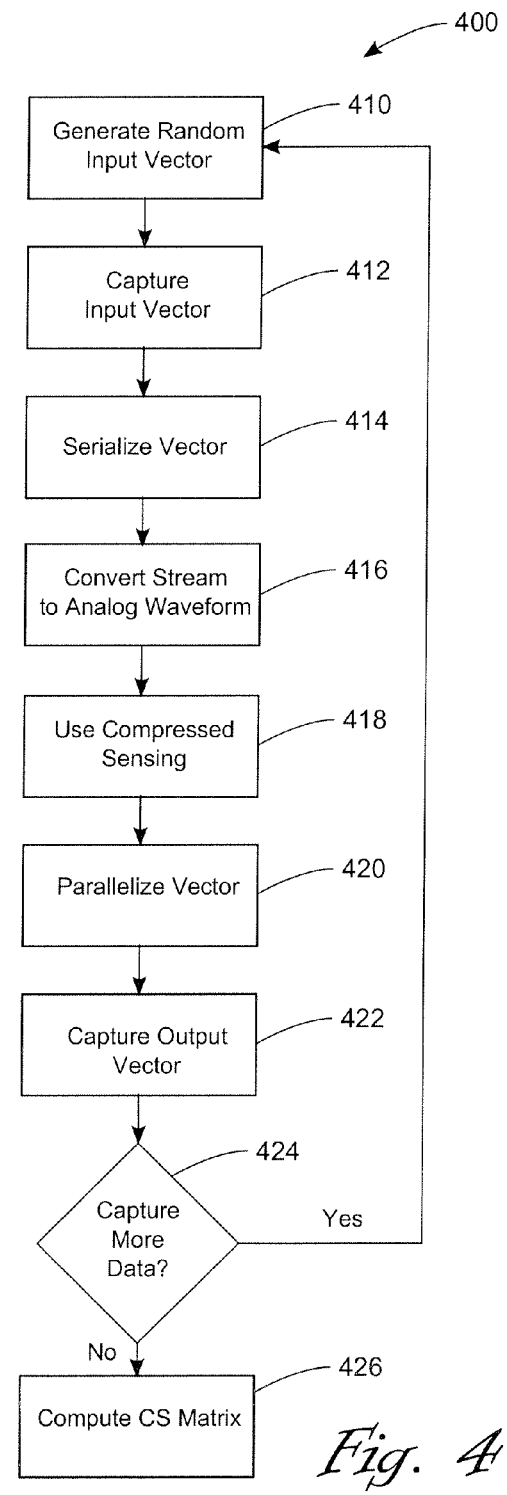
FIG. 4 is a another flowchart illustrating a method of another embodiment of the present invention.

The flow charts of FIGS. 3 and 4 depict the steps of exemplary methods of the invention in more detail. In this regard, some of the blocks of the flow chart may represent a module segment or portion of code of computer programs stored in or accessible by the various components of the system 10 or the system 100. In some alternative implementations, the functions noted in the various blocks may occur out of the order depicted in FIGS. 3 and 4. For example, two blocks shown in succession in FIGS. 3 and 4 may in fact be executed substantially concurrently, or the blocks may sometimes be executed in the reverse order depending upon the functionality involved.

Turning now to FIG. 3, in accordance with an embodiment of the invention a method 300 for characterizing the compressed sensing apparatus is described. In step 310 a random input vector x of length N is generated. This can be done using a variety of methods, but preferably a computer or other electronic device is utilized to generate the random input vector. In step 312 a copy of the input vector x is captured. Preferably, the input vector is captured and stored using an electronic component such as RAM, Flash, a register, a series of registers, or other volatile or non-volatile electronic storage component. In step 314, the vector is converted into an analog signal waveform. Step 314 can be performed, for example, using a commonly available arbitrary waveform generator. In step 316, a compressed sensing apparatus is used on the analog signal waveform generated in step 314. The compressed sensing apparatus used in step 316 will output a stream of digital numbers corresponding to reconstructed signal values. In step 318, the stream of digital numbers is parallelized into an output vector. In step 320, the output vector is captured. Preferably, the output vector is captured and stored using an electronic component such as RAM, Flash, a register or series of registers, or other volatile or non-volatile electronic storage component.

In step 322, it must be decided whether to capture additional data. Preferably, steps 310 through 320 are performed a predetermined number of times. In that case, step 322 is simply determining whether the number of passes through 310 through 320 equals the predetermined number. However, other methods may be used to determine if more data should be captured, as well. For example, an algorithm may be used that determines a the number of times to execute steps 310 through 320 based on the length of x and the length of y. Other methods may also be employed without deviating from the scope of the invention. If the method should capture more data, execution returns to step 310. Otherwise, step 324 is performed.

In step 324, a compressed sensing matrix characterizing the compressed sensing apparatus is determined. This step is preferably performed utilizing an electronic processor configured to execute a number of code segments for characterizing the compressed sensing apparatus. Regardless of the mechanism used, step 324 characterizes the compressed sensing apparatus by evaluating: $CS=Y*X^+$.

FIG. 4, illustrates a method 400 in accordance with another embodiment of the invention. Many of the steps of the method 400 of FIG. 4 generally correspond to the steps of method 300 of FIG. 3. Specifically, steps 410, 412, 418, 420, 422, 424 and 426 of FIG. 4 correspond to steps 310, 312, 316, 318, 320, 322 and 324 of FIG. 3. Therefore, only the differences between the embodiments shown in FIG. 3 and FIG. 4 will be discussed.

In step 414, the random vector generated in step 410 is converted into a serialized stream of digital numbers. Then in step 416, the stream of digital numbers is converted into an analog waveform. Step 416 can be performed using a single electronic component or a plurality of electronic components operable to convert digital data into an analog waveform. For example, a commercially available digital-to-analog converter, or any other device may be used.

Although the invention has been described with reference to the preferred embodiment illustrated in the attached drawing figures, it is noted that equivalents may be employed and substitutions made herein without departing from the scope of the invention as recited in the claims.

Having thus described the preferred embodiment of the invention, what is claimed as new and desired to be protected by Letters Patent includes the following:

1. A system for characterizing a compressed sensing apparatus, the system comprising:
   a random vector generator for generating an input vector;
   a waveform generator in communication with the random vector generator for converting the input vector into an analog signal;
   a compressed sensing apparatus in communication with the waveform generator for determining a first digital bit stream from the analog signal;
   a serial-to-parallel converter for converting the first digital bit stream into a second vector; and
   an electronic processor in communication with the random number generator and the serial-to-parallel converter configured for determining a compressed sensing matrix.

2. The system for characterizing a compressed sensing apparatus of claim 1, further comprising:
   an electronic memory in communication with the electronic processor for storing a plurality of input vectors and a plurality of output vectors.

3. The system for characterizing a compressed sensing apparatus of claim 2, wherein the processor is configured to compute the compressed sensing matrix by multiplying the plurality of output vectors by the pseudo-inverse of the plurality of input vectors.

4. The system for characterizing a compressed sensing apparatus of claim 1, wherein the waveform generator further comprises:
   a parallel-to-serial converter in communication with the random vector generator for converting the input vector into a second digital bit stream; and
   a digital-to-analog converter in communication with the parallel-to-serial converter for converting the second digital bit stream into an analog signal.

5. The system for characterizing a compressed sensing apparatus of claim 1, wherein the electronic processor is selected from the group consisting of an FPGA, an ASIC, and a CPU.

6. The system for characterizing a compressed sensing apparatus of claim 1, wherein the random vector generator is operable to output an N-element Gaussian random discrete-time vector.

7. The system for characterizing a compressed sensing apparatus of claim 1, wherein the electronic processor calculates the compressed sensing matrix using a least-square pseudo inverse fit between the input vector and the output vector.

8. A method of characterizing a compressed sensing apparatus, the method comprising:
   a data gathering step comprising:
      generating an input vector of random numbers;
      capturing the input vector;
      converting the input vector into an analog signal;
      reconstructing the analog signal into a digital bit stream using a compressed sensing apparatus;
      converting the digital bit stream into an output vector; and
      capturing the output vector;
   creating an input matrix from the captured input vector;
   creating an output matrix from the captured output vector; and
   determining the compressed sensing matrix based on the input vector and the output vector.

9. The method of claim 8, wherein the step of determining the compressed sensing matrix further comprises calculating the least square-pseudo inverse between the plurality of input vectors and the plurality of output vectors.

10. The method of claim 8, wherein the input vector is an N-element Gaussian random discrete-time vector.

11. The method of claim 8, wherein the step of converting the input vector into an analog signal further comprises:
   converting the input vector into a series of numbers; and
   providing the series of numbers to a digital-to-analog converter for creating the analog signal.

12. The method of claim 8, wherein the step of determining the compressed sensing matrix is performed using a device chosen from the group consisting of an FPGA, an ASIC, and a CPU.

13. The method of claim 8, wherein:
   the data gathering step is performed a number of times such that a plurality of input vectors are stored and a plurality of output vectors are stored; and
   the input matrix is created from the plurality of captured input vectors and the output matrix is created from the plurality of captured output vectors such that each column of the input matrix corresponds to each column of the output matrix.

14. A system for characterizing a compressed sensing apparatus comprising:
   a random vector generator for generating an input vector wherein the elements of the first vector comprise Gaussian random noise;
   a parallel-to-serial converter in communication with the random vector generator for converting the input vector into a first digital bit stream;
   a digital-to-analog converter in communication with the parallel-to-serial converter for converting the first digital bit stream into an analog signal;
   a compressed sensing apparatus in communication with the digital-to-analog converter for determining a second digital bit stream from the analog signal;
   a serial-to-parallel converter for converting the second digital bit stream into a second vector;
   an electronic processor in communication with the random number generator and the serial-to-parallel converter; and
   an electronic memory in communication with the electronic processor for storing a plurality of input vectors and a plurality of output vectors
   wherein the electronic processor is configured for determining a compressed sensing matrix based on the plurality of input vectors and the plurality of output vectors by multiplying the plurality of output vectors by the pseudo-inverse of the plurality of input vectors.

15. The system for characterizing a compressed sensing apparatus of claim 14, wherein the electronic processor is selected from the group consisting of an FPGA, an ASIC, and a CPU.

* * * * *